United States Patent [19]
Lee

[11] Patent Number: 6,114,889
[45] Date of Patent: Sep. 5, 2000

[54] PHASE LOCKED LOOP FOR RECOVERING CLOCK

[75] Inventor: Sang-Moon Lee, Seoul, Rep. of Korea

[73] Assignee: LG Electronics, Inc., Seoul, Rep. of Korea

[21] Appl. No.: 09/227,860

[22] Filed: Jan. 11, 1999

[30] Foreign Application Priority Data

Jan. 12, 1998 [KR] Rep. of Korea ............ 599/1998

[51] Int. Cl.[7] .................................................. H03L 7/06
[52] U.S. Cl. ........................................ 327/159; 327/150
[58] Field of Search .................................. 327/146, 153, 327/155–163, 2, 3, 12; 331/17; 375/373–376

[56] References Cited

U.S. PATENT DOCUMENTS

| | | | |
|---|---|---|---|
| 5,036,221 | 7/1991 | Brucculeri et al. | 327/12 |
| 5,386,437 | 1/1995 | Yasuda | 375/120 |
| 5,799,048 | 8/1998 | Farjad-Rad et al. | 375/360 |
| 5,828,243 | 10/1998 | Bagley | 327/99 |
| 5,936,430 | 8/1999 | Patterson | 327/12 |

*Primary Examiner*—My-Trang Nu Ton

[57] ABSTRACT

A PLL (phase locked loop) for recovering a clock preventing a DC value of an output voltage of a phase detector from being deviated in one-sided direction and maintaining a center frequency of a VCO, to thereby minimize the occurrence of timing errors, in the case where the period of a reference input signal to the phase detector is irregular and a part of a pulse column of the signal is omitted, in performing a clock recovery operation in a digital magnetic recording equipment or a digital communication system. The PLL includes: a phase detector having first and second signal delay parts and a first logical computing element, for detecting a phase of an output signal; and a voltage controlled oscillator for generating a predetermined frequency signal, the phase is detector further comprised of a second logical computing element for logically operating a reference input signal and an output signal of the voltage controlled oscillator to thereby output the result signal, and a third logical computing element for logically operating the output signals from the first and second logical computing elements to thereby output the result signal.

10 Claims, 8 Drawing Sheets

DC VOLTAGE

DC VOLTAGE

FIG.6A
Background Art
FIG.6B
Background Art
FIG.6C
Background Art
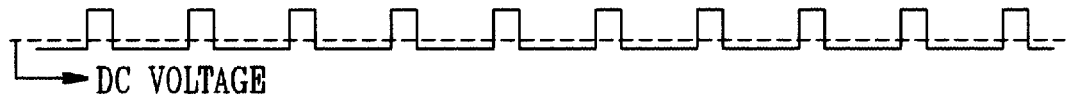
→ DC VOLTAGE
FIG.7A
Background Art
FIG.7B
Background Art
FIG.7C
Background Art
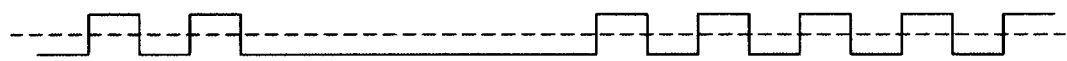
FIG.7D
Background Art
DC VOLTAGE CORRESPONDING TO CENTER FREQUENCY OF VCO 'A'   DC VOLTAGE OF OUTPUT SIGNAL 'C' OF PHASE DETECTOR AFTER PASSING THROUGH LOOP FILTER

↳ DC VOLTAGE

→ DC VOLTAGE

→ DC VOLTAGE

PHASE LOCKED LOOP FOR RECOVERING CLOCK

BACKGROUND OF THE INVENTION

1. Field of the Invention

The present invention relates to a phase locked loop (hereinafer, referred to as "PLL"), and more particularly, to a PLL for recovering a clock.

2. Discussion of Related Art

Generally, an apparatus for recovering a clock is requisite for a digital magnetic recording equipment or a digital communication system. In this case, of course, the clock recovering operation of the apparatus is very important for the normal operation of the equipment or system.

As well known, a PLL as the apparatus for recovering a clock is widely used.

Now, an explanation of the construction of a conventional PLL will be discussed with reference to FIGS. 1 and 2.

FIG. 1 is a circuit diagram illustrating the construction of a conventional PLL. As shown, the PLL is comprised of a phase detector 10 for comparing the phase of a reference input signal and the phase of a feedback signal, a loop filter 20 for filtering the phase of an output signal from the phase detector 10 and for eliminating a high frequency component of the filtered signal to thereby output a predetermined voltage of signal, and a voltage controlled oscillator (hereinafter, referred to as "VCO") 30 for generating a predetermined frequency in accordance with the voltage of the output signal from the loop filter 20.

FIG. 2 is a detailed circuit diagram of the phase detector 10 in FIG. 1. The phase detector 10 includes a first D flip-flop 11 for delaying the reference input signal during a predetermined period of time to thereby output the delayed signal, a second D flip-flop 12 for delaying the feedback signal of the output signal from the VCO 30 during a predetermined period of time to thereby output the delayed signal, and an exclusive OR gate 13 for exclusively ORing the output signals of the first and second D flip-flops 11 and 12 to thereby output the ORed signal.

FIG. 3 is a graph illustrating a signal transmitting characteristic of the phase detector 10 of FIG. 2, and FIGS. 4A to 4C are waveform diagrams illustrating output states of the components of the conventional PLL, in the case where a phase difference between the reference input signal to the phase detector 10 and the output signal of the VCO 30 corresponds to Π radian.

FIGS. 5A to 5C are waveform diagrams illustrating output states of the components of the conventional PLL, in the case where the phase of the reference input signal to the phase detector 10 precedes the phase of the output signal of the VCO 30, on the basis of the Π radian. FIGS. 6A to 6C are waveform diagrams illustrating output states of the components of the conventional PLL, in the case where the phase of the reference input signal to the phase detector 10 is behind the phase of the output signal of the VCO 30, on the basis of the Π radian. FIGS. 7A to 7D are waveform diagrams illustrating output states of the components of the conventional PLL, in the case where the period of the reference input signal to the phase detector 10 is irregular and a part of a pulse column of the signal is omitted.

Next, an explanation of the operation of the conventional PLL will be discussed with reference to FIG. 3 to FIGS. 7A to 7D.

Firstly, the phase detector 10 compares the phases between the reference input signal and the feedback signal from the output signal of the VCO 30 and outputs the compared result.

In more detail, the first D flip-flop 11 of the phase detector 10 delays the reference input signal 'a' during the predetermined period of time to thereby output the delayed signal, as shown in FIG. 2.

On the other hand, the second D flip-flop 12 of the phase detector 10 delays the feedback signal 'b' of the output signal from the VCO 30 during the predetermined period of time to thereby output the delayed signal.

As a result, the exclusive OR gate 13 of the phase detector 10 exclusively ORes the output signals of the first and second D flip-flops 11 and 12 to thereby output the ORed signal 'c'.

The output signal 'c' of the phase detector 10 has a linear characteristic in the range of 2Π radian, as shown in FIG. 3.

Next, the loop filter 20 filters the phase of the output signal 'c' from the phase detector 10 and eliminates a high frequency component of the filtered signal to thereby output a predetermined voltage of signal. Then, the VCO 30 generates a predetermined frequency in accordance with the voltage of the output signal from the loop filter 20 and then outputs a recovered clock.

Now, an explanation of the operation of the phase detector 10 of the conventional PLL will be in detail given.

Firstly, in the case where a phase difference between the reference input signal 'a' to the phase detector 10 and the output signal 'b' of the VCO 30 corresponds to Π radian, the first D flip-flop 11 delays and outputs the reference input signal 'a' as the waveform shown in FIG. 4A during the predetermined period of time. Also, the second D flip-flop 12 delays and outputs the feedback signal 'b' of the output signal from the VCO 30 as the waveform shown in FIG. 4B during the predetermined period of time. As a result, the exclusive OR gate 13 of the phase detector 10 exclusively ORes the output signals of the first and second D flip-flops 11 and 12 to thereby output the ORed signal 'c' as the waveform shown in FIG. 4C.

At this time, if a direct current (DC) voltage outputted from the exclusive OR gate 13 is detected, it can be noted that the DC voltage has an intermediate value of the waveform as shown in FIG. 4C.

Secondly, in the case where the phase of the reference input signal 'a' to the phase detector 10 precedes the phase of the output signal 'b' of the VCO 30, on the basis of the Π radian, the first D flip-flop 11 delays and outputs the reference input signal 'a' as the waveform shown in FIG. 5A during the predetermined period of time. Also, the second D flip-flop 12 delays and outputs the feedback signal 'b' of the output signal from the VCO 30 as the waveform shown in FIG. 5B during the predetermined period of time. As a result, the exclusive OR gate 13 of the phase detector 10 exclusively ORes the output signals of the first and second D flip-flops 11 and 12 to thereby output the ORed signal 'c' as the waveform shown in FIG. 5C.

At this time, if the DC voltage outputted from the exclusive OR gate 13 is detected, it can be noted that the DC voltage has a value higher than the intermediate value of the waveform as shown in FIG. 5C.

Thirdly, in the case where the phase of the reference input signal 'a' to the phase detector 10 is behind the phase of the output signal 'b' of the VCO 30, on the basis of the Π radian, the first D flip-flop 11 delays and outputs the reference input signal 'a' as the waveform shown in FIG. 6A during the predetermined period of time. Also, the second D flip-flop 12 delays and outputs the feedback signal 'b' of the output signal from the VCO 30 as the waveform shown in FIG. 6B during the predetermined period of time. As a result, the exclusive OR gate 13 of the phase detector 10 exclusively ORes the output signals of the first and second D flip-flops 11 and 12 to thereby output the ORed signal 'c' as the waveform shown in FIG. 6C.

At this time, if the DC voltage outputted from the exclusive OR gate 13 is detected, it can be noted that the DC voltage has a value lower than the intermediate value of the waveform as shown in FIG. 6C.

Finally, in the case where the period of the reference input signal 'a' to the phase detector 10 is irregular and a part of a pulse column of the signal is omitted, the first D flip-flop 11 delays and outputs the reference input signal 'a' as the waveform shown in FIG. 7A during the predetermined period of time. Also, the second D flip-flop 12 delays and outputs the feedback signal 'b' of the output signal from the VCO 30 as the waveform shown in FIG. 7B during the predetermined period of time. As a result, the exclusive OR gate 13 of the phase detector 10 exclusively ORes the output signals of the first and second D flip-flops 11 and 12 to thereby output the ORed signal 'c' as the waveform shown in FIG. 7C.

At this time, if the DC voltage outputted from the exclusive OR gate 13 is detected, it can be noted that the DC voltage has an intermediate value of the waveform as shown in FIG. 7C.

The loop filter 20 filters the phase of the output signal 'c' from the phase detector 10 and eliminates the high frequency component of the filtered signal to thereby output a predetermined voltage of signal, as shown in FIG. 7D. As known from FIG. 7D, the DC voltage within the area of "A" is below the intermediate value of the DC voltage. Accordingly, the VCO 30 fails to maintain a center frequency as shown in FIG. 3 and thus produces frequency deviation in one-sided direction, which results in generation of a timing error.

Hence, the conventional PLL contains a problem to be solved that in the case where a part of the pulse column of the reference input signal does not exist, since the VCO can not maintain the center frequency and thus generates the frequency deviation in the one-sided direction, a timing error inevitably occurs.

SUMMARY OF THE INVENTION

Accordingly, the present invention is directed to a PLL for recovering a clock that substantially obviates one or more of the problems due to limitations and disadvantages of the related arts.

An object of the invention is to provide a PLL for recovering a clock which can prevent a DC value of an output voltage of a phase detector from being deviated in one-sided direction and maintain a center frequency of a VCO, to thereby minimize the occurrence of timing errors, in the case where the period of a reference input signal to the phase detector is irregular and a part of a pulse column of the signal is omitted, in performing a clock recovery operation in a digital magnetic recording equipment or a digital communication system.

According to an aspect of the present invention, a PLL for recovering a clock includes: a phase detector having first and second signal delay parts and a first logical computing element; and a VCO, the phase detector further comprised of a second logical computing element for logically operating a reference input signal and an output signal of the VCO to thereby output the result signal, and a third logical computing element for logically operating the output signals from the first and second logical computing elements to thereby output the result signal.

Preferably, the first to third logical computing elements are each comprised of an exclusive OR gate.

The third logical computing element prevents a DC value of an output signal from being deviated in one-sided direction, in the case where the period of the reference input signal is irregular and a part of a pulse column of the signal is omitted.

The third logical computing element outputs a DC voltage having a value higher than an intermediate value of a normal DC voltage, in the case where the phase of the reference input signal precedes the feedback signal from the VCO, on the basis of Π radian.

The third logical computing element outputs a DC voltage having a value lower than the intermediate value of the normal DC voltage, in the case where the phase of the reference input signal is behind the feedback signal from the VCO, on the basis of the Π radian.

The third logical computing element outputs a DC voltage having a value adjacent to the intermediate value of the normal DC voltage, in the case where the period of the reference input signal is irregular and a part of a pulse column of the signal is omitted.

According to another aspect of the present invention, a PLL for recovering a clock includes: a first signal delay part for delaying and outputting a reference input signal during a predetermined period of time; a second signal delay part for delaying and outputting a feedback signal during a predetermined period of time; a first logical computing element for logically operating the output signals of the first and second signal delay parts to thereby output the result signal; a second logical computing element for logically operating the reference input signal and the feedback signal to thereby output the result signal; a third logical computing element for logically operating the output signals from the first and second logical computing elements to thereby output the result signal; a loop filter for filtering the phase of the third logical computing element and eliminating a high frequency component of the filtered signal to thereby output a predetermined voltage of signal; and a VCO for generating a predetermined frequency in accordance with a voltage of the output signal of the loop filter.

Preferably, the first to third logical computing elements are each comprised of an exclusive OR gate.

The third logical computing element prevents a DC value of an output signal from being deviated in one-sided direction, in the case where the period of the reference input signal is irregular and a part of a pulse column of the signal is omitted.

The third logical computing element outputs a DC voltage having a value higher than an intermediate value of a normal DC voltage, in the case where the phase of the reference input signal precedes the feedback signal from the VCO, on the basis of Π radian.

The third logical computing element outputs a DC voltage having a value lower than the intermediate value of the normal DC voltage, in the case where the phase of the reference input signal is behind the feedback signal from the VCO, on the basis of the Π radian.

The third logical computing element outputs a DC voltage having a value adjacent to the intermediate value of the normal DC voltage, in the case where the period of the reference input signal is irregular and a part of a pulse column of the signal is omitted.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings.

In the drawings:

FIGS. 6A to 6C are waveform diagrams illustrating output states of the components of the conventional PLL, in the case where the phase of the reference input signal to the phase detector is behind the phase of the output signal of the VCO, on the basis of the Π radian;

FIGS. 7A to 7D are waveform diagrams illustrating output states of the components of the conventional PLL, in the case where the period of the reference input signal to the phase detector is irregular and a part of a pulse column of the signal is omitted;

Figure 8:
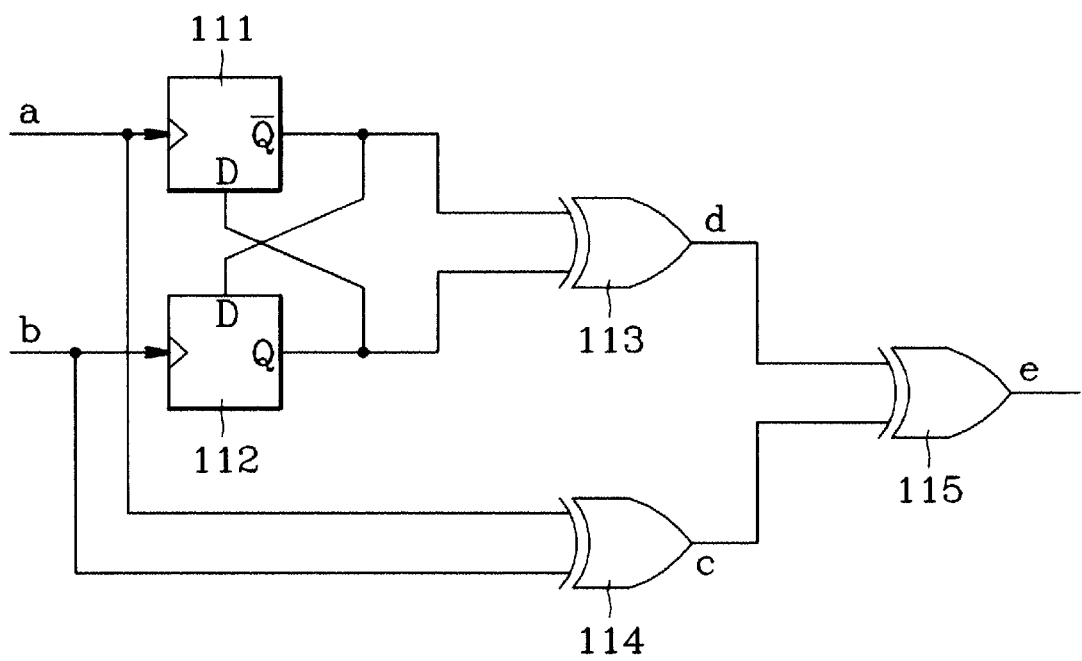
FIG. 8 is a detailed circuit diagram of the phase detector of a PLL for recovering a clock constructed in accordance with the present invention.

FIGS. 11A to 11E are waveform diagrams illustrating output states of the components of the PLL of the present invention, in the case where the phase of the reference input signal to the phase detector of FIG. 8 is behind the phase of the output signal of the VCO, on the basis of the Π radian; and FIGS. 12A to 12E are waveform diagrams illustrating output states of the components of the PLL of the present invention, in the case where the period of the reference input signal to the phase detector of FIG. 8 is irregular and a part of a pulse column of the signal is omitted.

DETAILED DESCRIPTION OF PREFERRED EMBODIMENT

Reference will now be made in detail to the preferred embodiments of the present invention, examples of which are illustrated in the accompanying drawings.

Hereinafter, an explanation of the construction of a PLL for recovering a clock according to the present invention will be discussed with reference to FIG. 8.

Figure 1:
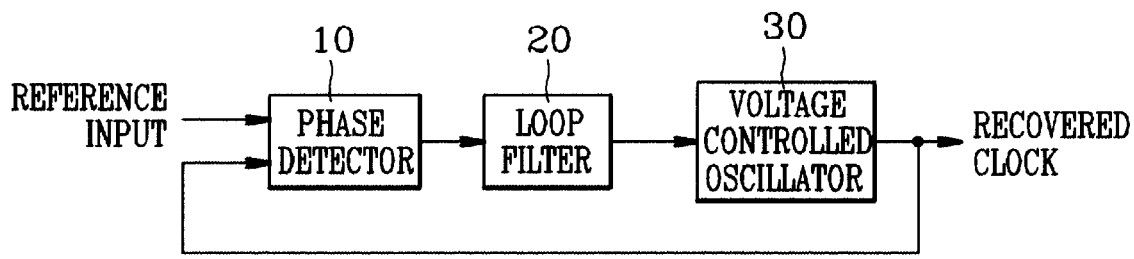
FIG. 1 is a circuit diagram illustrating the construction of a conventional PLL.
Figure 2:
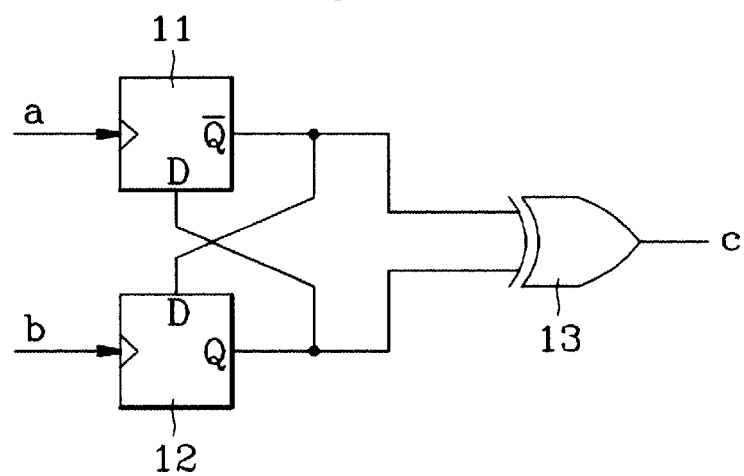
FIG. 2 is a detailed circuit diagram of the phase detector 10 in FIG. 1.
Figure 3:
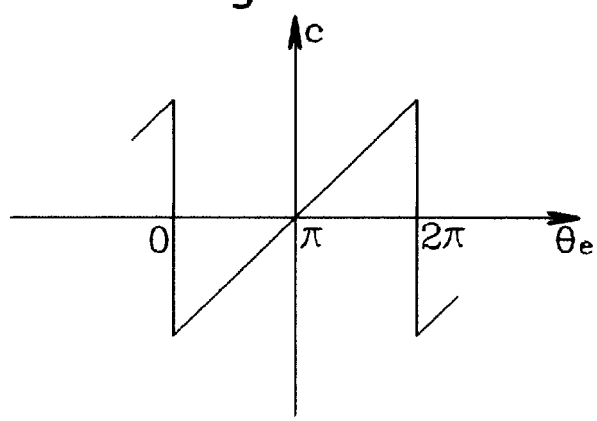
FIG. 3 is a graph illustrating a signal transmitting characteristic of the phase detector of FIG. 2.
Figure 4A:
FIGS. 4A to 4C are waveform diagrams illustrating output states of the components of the conventional PLL, in the case where a phase difference between the reference input signal to the phase detector and the output signal of the VCO corresponds to Π radian.
Figure 4B:
Figure 4C:
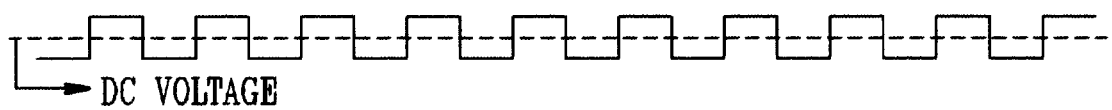
Figure 5A:
FIGS. 5A to 5C are waveform diagrams illustrating output states of the components of the conventional PLL, in the case where the phase of the reference input signal to the phase detector precedes the phase of the output signal of the VCO, on the basis of the Π radian.
Figure 5B:
Figure 5C:
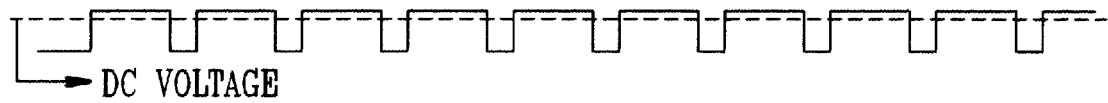

FIG. 8 is a detailed circuit diagram of the phase detector of the PLL for recovering a clock constructed in accordance with the present invention. In the same manner as FIG. 1, the PLL is comprised of a phase detector 110 for comparing the phase of a reference input signal and the phase of a feedback signal, a loop filter 120 for filtering the phase of the output signal from the phase detector 110 and for eliminating a high frequency component of the filtered signal to thereby output a predetermined voltage of signal, and a VCO 130 for generating a predetermined frequency in accordance with the voltage of the output signal from the loop filter 120.

As shown, the phase detector 110 includes a first D flip-flop 111 for delaying the reference input signal 'a' during a predetermined period of time to thereby output the delayed signal, a second D flip-flop 112 for delaying the feedback signal 'b' of the output signal from the VCO 130 during a predetermined period of time to thereby output the delayed signal, a first exclusive OR gate 113 for exclusively ORing the output signals of the first and second D flip-flops 11 and 12 to thereby output the ORed signal 'd', a second exclusive OR gate 114 for exclusively ORing the reference input signal 'a' and the feedback signal 'b' of the output signal from the VCO 130 to thereby output the result signal 'c', and a third exclusive OR gate 115 for exclusively ORing the output signals 'd' and 'c' of the first and second exclusive OR gates 113 and 114 to thereby output the ORed signal 'e'.

Figure 9A:
FIGS. 9A to 9E are waveform diagrams illustrating output states of the components of the PLL of the present invention, in the case where a phase difference between the reference input signal to the phase detector of FIG. 8 and the output signal of the VCO corresponds to Π radian.
Figure 9B:
Figure 9C:
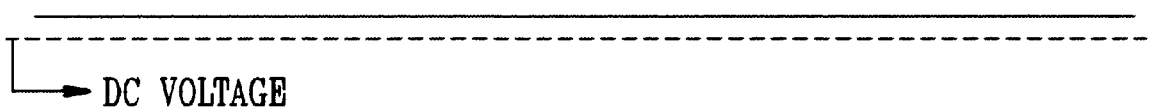
Figure 9D:
Figure 9E:
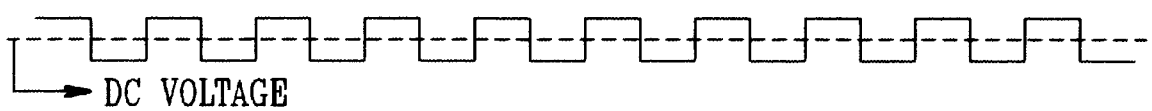
Figure 10A:
FIGS. 10A to 10E are waveform diagrams illustrating output states of the components of the PLL of the present invention, in the case where the phase of the reference input signal to the phase detector of FIG. 8 precedes the phase of the output signal of the VCO, on the basis of the Π radian.
Figure 10B:

FIGS. 9A to 9E are waveform diagrams illustrating output states of the components of the PLL of the present invention, in the case where a phase difference between the reference input signal to the phase detector of FIG. 8 and the output signal of the VCO corresponds to Π radian, and FIGS. 10A to are waveform diagrams illustrating output states of the components of the PLL of the present invention, in the case where the phase of the reference input signal to the phase detector of FIG. 8 precedes the phase of the output signal of the VCO, on the basis of the Π radian.

FIGS. 11A to 11E are waveform diagrams illustrating output states of the components of the PLL of the present invention, in the case where the phase of the reference input signal to the phase detector of FIG. 8 is behind the phase of the output signal of the VCO, on the basis of the Π radian, and FIGS. 12A to 12E are waveform diagrams illustrating output states of the components of the PLL of the present invention, in the case where the period of the reference input signal to the phase detector of FIG. 8 is irregular and a part of a pulse column of the signal is omitted.

Now, an explanation of the operation of the PLL for recovering clock according to the present invention will be discussed with reference to FIG. 8 to FIGS. 12A to 12E. Firstly, the phase detector 110 compares the phases between the reference input signal and the feedback signal from the output signal of the VCO 130 and outputs the compared result.

In more detail, the first D flip-flop 111 of the phase detector 110 delays the reference input signal 'a' during a predetermined period of time to thereby output the delayed signal, as shown in FIG. 8.

On the other hand, the second D flip-flop 112 of the phase detector 110 delays the feedback signal 'b' of the output signal from the VCO 130 during a predetermined period of time to thereby output the delayed signal.

At this time, the first exclusive OR gate 113 of the phase detector 110 exclusively ORes the output signals of the first and second D flip-flops 111 and 112 to thereby output the ORed signal 'd'.

In addition, the second exclusive OR gate 114 of the phase detector 110 exclusively ORes the reference input signal 'a' and the feedback signal 'b' of the output signal from the VCO 130 to thereby output the result signal 'c'.

As a result, the third exclusive OR gate 115 exclusively ORing the output signals 'd' and 'c' of the first and second exclusive OR gates 113 and 114 to thereby output the ORed signal 'e'.

Next, the loop filter 120 filters the phase of the output signal 'e' from the phase detector 110 and eliminates a high frequency component of the filtered signal to thereby output a predetermined voltage of signal. Then, the VCO 130 generates a predetermined frequency in accordance with the voltage of the output signal from the loop filter 120 and outputs a recovered clock.

Hereinafter, an explanation of the operation of the phase detector 110 of the present invention will be in detail given.

Firstly, in the case where a phase difference between the reference input signal 'a' to the phase detector 110 of FIG. 8 and the output signal 'b' of the VCO 130 corresponds to Π radian, the first D flip-flop 111 delays and outputs the reference input signal 'a' as the waveform shown in FIG. 9A during the predetermined period of time. Also, the second D flip-flop 112 delays and outputs the feedback signal 'b' of the output signal from the VCO 130 as the waveform shown in FIG. 9B during the predetermined period of time. As a result, the first exclusive OR gate 113 of the phase detector 110 exclusively ORes the output signals of the first and second D flip-flops 111 and 112 to thereby output the ORed signal 'd' as the waveform shown in FIG. 9D.

In addition, the second exclusive OR gate 114 of the phase detector 110 exclusively ORes the reference input signal 'a' and the feedback signal 'b' of the output signal from the VCO 130 to thereby output the result signal 'c' as the waveform shown in FIG. 9C.

As a result, the third exclusive OR gate 115 exclusively ORing the output signals 'd' and 'c' of the first and second exclusive OR gates 113 and 114 to thereby output the ORed signal 'e' as the waveform shown in FIG. 9E.

At this time, if a DC voltage outputted from the third exclusive OR gate 115 is detected, it can be noted that the DC voltage has an intermediate value of the waveform as shown in FIG. 9E.

Secondly, in the case where the phase of the reference input signal 'a' to the phase detector 110 of FIG. 8 precedes the phase of the output signal of the VCO, on the basis of the Π radian, the first D flip-flop 111 delays and outputs the reference input signal 'a' as the waveform shown in FIG. 10A during the predetermined period of time. Also, the second D flip-flop 112 delays and outputs the feedback signal 'b' of the output signal from the VCO 130 as the waveform shown in FIG. 10B during the predetermined period of time. As a result, the first exclusive OR gate 113 of the phase detector 110 exclusively ORes the output signals of the first and second D flip-flops 111 and 112 to thereby output the ORed signal 'd' as the waveform shown in FIG. 10D.

Figure 10C:
Figure 10D:

In addition, the second exclusive OR gate 114 of the phase detector 110 exclusively ORes the reference input signal 'a' and the feedback signal 'b' of the output signal from the VCO 130 to thereby output the result signal 'c' as the waveform shown in FIG. 10C.

Figure 10E:
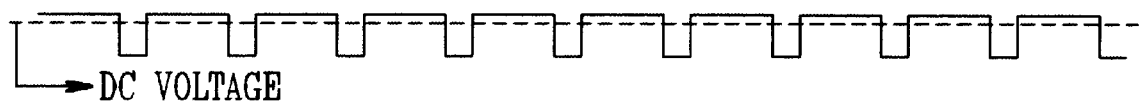

As a result, the third exclusive OR gate 115 exclusively ORing the output signals 'd' and 'c' of the first and second exclusive OR gates 113 and 114 to thereby output the ORed signal 'e' as the waveform shown in FIG. 10E.

At this time, if the DC voltage outputted from the third exclusive OR gate 115 is detected, it can be noted that the DC voltage has a value higher than the intermediate value of the waveform as shown in FIG. 10E.

Figure 11A:
Figure 11B:

Thirdly, in the case where the phase of the reference input signal 'a' to the phase detector of FIG. 8 is behind the phase of the output signal 'b' of the VCO, on the basis of the Π radian, the first D flip-flop 111 delays and outputs the reference input signal 'a' as the waveform shown in FIG. 11A during the predetermined period of time. Also, the second D flip-flop 112 delays and outputs the feedback signal 'b' of the output signal from the VCO 130 as the waveform shown in FIG. 11B during the predetermined period of time. As a result, the first exclusive OR gate 113 of the phase detector 110 exclusively ORes the output signals of the first and second D flip-flops 111 and 112 to thereby output the ORed signal 'd' as the waveform shown in FIG. 11D.

Figure 11C:
Figure 11D:

In addition, the second exclusive OR gate 114 of the phase detector 110 exclusively ORes the reference input signal 'a' and the feedback signal 'b' of the output signal from the VCO 130 to thereby output the result signal 'c' as the waveform shown in FIG. 11C.

Figure 11E:

As a result, the third exclusive OR gate 115 exclusively ORing the output signals 'd' and 'c' of the first and second exclusive OR gates 113 and 114 to thereby output the ORed signal 'e' as the waveform shown in FIG. 11E.

At this time, if the DC voltage outputted from the third exclusive OR gate 115 is detected, it can be noted that the DC voltage has a value lower than the intermediate value of the waveform as shown in FIG. 11E.

Figure 12A:
Figure 12B:

Finally, upon recovery of clock of a digital signal, in the case where the period of the reference input signal 'a' to the phase detector 110 of FIG. 8 is irregular and a part of a pulse column of the signal is omitted, the first D flip-flop 111 delays and outputs the reference input signal 'a' as the waveform shown in FIG. 12A during the predetermined period of time. Also, the second D flip-flop 112 delays and outputs the feedback signal 'b' of the output signal from the VCO 130 as the waveform shown in FIG. 12B during the predetermined period of time. As a result, the first exclusive OR gate 113 of the phase detector 110 exclusively ORes the output signals of the first and second D flip-flops 111 and 112 to thereby output the ORed signal 'd' as the waveform shown in FIG. 12D.

Figure 12C:
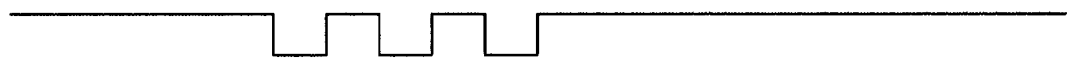
Figure 12D:

In addition, the second exclusive OR gate 114 of the phase detector 110 exclusively ORes the reference input signal 'a' and the feedback signal 'b' of the output signal from the VCO 130 to thereby output the result signal 'c' as the waveform shown in FIG. 12C.

Figure 12E:
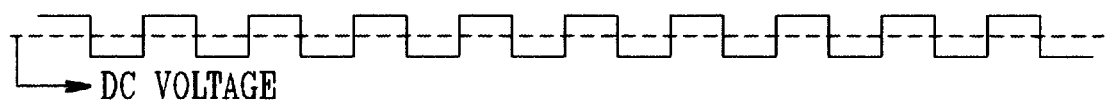

As a result, the third exclusive OR gate 115 exclusively ORing the output signals 'd' and 'c' of the first and second exclusive OR gates 113 and 114 to thereby output the ORed signal 'e' as the waveform shown in FIG. 12E.

At this time, if the DC voltage outputted from the third exclusive OR gate 115 is detected, it can be noted that the DC voltage has an intermediate value of the waveform as shown in FIG. 12E.

As set forth in the above, a PLL for recovering a clock according to the present invention can prevent a DC value of an output voltage of a phase detector from being deviated in one-sided direction and maintain a center frequency of a VCO, to thereby minimize the occurrence of timing errors, in the case where the period of a reference input signal of the phase detector is irregular and a part of a pulse column of the signal is omitted, that is, data '0' is continuously inputted on any interval, upon recovery of the clock of a digital signal.

Moreover, a PLL for recovering a clock according to the present invention can include a phase detector which has a complete function of recovering the clock of random data and also can be applied in processing all digital signals.

It will be apparent to those skilled in the art that various modifications and variations can be made in a PLL for recovering a clock of the present invention without departing from the spirit or scope of the invention. Thus, it is intended that the present invention cover the modifications and variations of this invention provided they come within the scope of the appended claims and their equivalents.

What is claimed is:

1. A phase locked loop for recovering a clock having a phase detector having first and second signal delay parts and a first logical computing element, for detecting a phase of an output signal, and a voltage controlled oscillator for generating a predetermined frequency, said phase locked loop comprising:

said phase detector further comprised of a second logical computing element for logically operating a reference input signal and an output signal of said voltage controlled oscillator to thereby output the result signal, and a third logical computing element for logically operating the output signals from said first and second logical computing elements to thereby output the result signal; wherein said first to third logical computing elements are each comprised of an exclusive OR gate.

2. The phase locked loop as defined in claim 1, wherein said third logical computing element prevents a direct current (DC) value of its output signal from being deviated in one-sided direction, in the case where the period of said reference input signal is irregular and a part of a pulse column of said signal is omitted.

3. The phase locked loop as defined in claim 1, wherein said third logical computing element outputs a DC voltage having a value higher than an intermediate value of a normal DC voltage, in the case where the phase of said reference input signal precedes a feedback signal from said voltage controlled oscillator, on the basis of Π radian.

4. The phase locked loop as defined in claim 1, wherein said third logical computing element outputs a DC voltage having a value lower than the intermediate value of the normal DC voltage, in the case where the phase of said reference input signal is behind a feedback signal from said voltage controlled oscillator, on the basis of the Π radian.

5. The phase locked loop as defined in claim 1, wherein said third logical computing element outputs a DC voltage having a value adjacent to an intermediate value of a normal DC voltage, in the case where the period of said reference input signal is irregular and a part of a pulse column of said signal is omitted.

6. A phase locked loop for recovering a clock, comprising:

a first signal delay part for delaying and outputting a reference input signal during a predetermined period of time;

a second signal delay part for delaying and outputting a feedback signal during a predetermined period of time;

a first logical computing element for logically operating output signals of said first and second signal delay parts to thereby output a result signal;

a second logical computing element for logically operating said reference input signal and said feedback signal to thereby output the result signal;

a third logical computing element for logically operating the output signals from said first and second logical computing elements to thereby output the result signal;

a loop filter for filtering the phase of said third logical computing element and eliminating a high frequency component of the filtered signal to thereby output a predetermined voltage of signal; and a voltage controlled oscillator for generating a predetermined frequency in accordance with a voltage of the output signal of said loop filter;

wherein said first to third logical computing elements are each comprised of an exclusive OR gate.

7. The phase locked loop as defined in claim 6, wherein said third logical computing element prevents a DC value of an output signal from being deviated in one-sided direction, in the case where the period of said reference input signal is irregular and a part of a pulse column of said signal is omitted.

8. The phase locked loop as defined in claim 6, wherein said third logical computing element outputs a DC voltage having a value higher than an intermediate value of a normal DC voltage, in the case where the phase of said reference input signal precedes the feedback signal from said voltage controlled oscillator, on the basis of Π radian.

9. The phase locked loop as defined in claim 6, wherein said third logical computing element outputs a DC voltage having a value lower than an intermediate value of a normal DC voltage, in the case where the phase of said reference input signal is behind the feedback signal from said voltage controlled oscillator, on the basis of the Π radian.

10. The phase locked loop as defined in claim 6, wherein said third logical computing element outputs a DC voltage having a value adjacent to an intermediate value of a normal DC voltage, in the case where the period of said reference input signal is irregular and a part of a pulse column of said signal is omitted.

* * * * *